United States Patent [19]

Lur et al.

[11] Patent Number: 5,565,376
[45] Date of Patent: *Oct. 15, 1996

[54] DEVICE ISOLATION TECHNOLOGY BY LIQUID PHASE DEPOSITION

[75] Inventors: Water Lur, Taipei; Lawrence Y. Lin, Hsinchu, both of Taiwan

[73] Assignee: United Microelectronics Corp., Hsinchu City, Taiwan

[*] Notice: The term of this patent shall not extend beyond the expiration date of Pat. No. 5,445,987.

[21] Appl. No.: 275,014

[22] Filed: Jul. 12, 1994

[51] Int. Cl.$^6$ ..................................................... H01L 21/76
[52] U.S. Cl. .............................. 437/67; 437/72; 437/238
[58] Field of Search .................................... 437/228, 229, 437/230, 235, 238, 239, 241, 242, 243, 920, 67, 72; 148/DIG. 50, DIG. 86, DIG. 87, DIG. 117, DIG. 118

[56] References Cited

U.S. PATENT DOCUMENTS

| | | | |
|---|---|---|---|
| 5,256,593 | 10/1993 | Iwai | 437/70 |
| 5,445,989 | 8/1995 | Lur et al. | 437/67 |
| 5,453,395 | 9/1995 | Lur | 437/67 |
| 5,472,902 | 12/1995 | Lur | 437/62 |

OTHER PUBLICATIONS

"A selective $SiO_2$ film–formation technology using Liquid–Phase Deposition for Fully Planarized Multilevel Interconnections", J. Electrochem. Soc., vol. 140, No. 8, Aug. 1993, pp. 2410–2414.

Primary Examiner—Janet C. Baxter
Assistant Examiner—Christopher G. Young
Attorney, Agent, or Firm—Ladas & Parry

[57] ABSTRACT

A new method of forming device isolation regions on a silicon substrate is provided. This method comprises the following steps: a pad oxide layer is formed on the silicon substrate; a silicon nitride layer is formed on the pad oxide layer; portions of the silicon nitride and pad oxide layers not covered by a mask pattern are etched through and into the silicon substrate so as to provide a plurality of wide and narrow trenches within the silicon substrate that will form the device isolation regions; silicon nitride spacers are formed on the sidewalls of the trenches; a thin oxide layer is grown on all exposed surfaces of the substrate by using thermal oxidation; a first liquid phase deposition oxide layer is formed on the thin oxide layer and is densified by a thermal process to form cracks therein; the silicon nitride layer and silicon nitride spacers are removed through the cracks, wherein the first liquid phase deposition oxide layer over the silicon nitride layer and silicon nitride spacers are also lift-off; the pad oxide layer is then removed; and a second liquid phase deposition oxide layer is formed on the first liquid phase deposition oxide layer so as to fill the trenches.

15 Claims, 4 Drawing Sheets

DEVICE ISOLATION TECHNOLOGY BY LIQUID PHASE DEPOSITION

BACKGROUND OF THE INVENTION

1. Field of the Invention

The present invention relates to the field of semiconductor integrated circuit (IC) manufacturing, and more particularly to a method of forming device isolation regions on a semiconductor substrate by using selective liquid-phase-deposition (LPD) of silicon dioxide.

2. Prior Art

With the continual improvement of semiconductor integrated circuit fabrication techniques, the number of devices which can be packed onto a semiconductor chip has greatly increased, while the size of the individual devices has decreased markedly. Today several million devices can be fabricated in a single chip—consider, for example, the mega-bit memory chips which are commonly used today in personal computers and in other applications. In such high-density chips, elements must be isolated properly in order to obtain good performance. The main purpose of device isolation techniques is to provide good insulation between the elements of the devices using smaller isolation area, to provide more space for more devices and their elements.

In the past, the so-called LOCal Oxidation of Silicon (LOCOS) technique has been widely used for device isolation of integrated circuit chips. According to this method, a thick oxide is grown as an isolating layer. FIGS. 1A to 1D demonstrate the prior art LOCOS technique. At first, a pad oxide layer 11 and then a silicon nitride layer 12 are formed on a silicon substrate 10. Those layers are patterned using lithography and etching techniques, providing the structure shown in FIG. 1A. After that, impurities of P type, such as boron ions, are implanted into the exposed portion of the substrate 10, to form a channel stop layer 13, as shown in FIG. 1B.

Referring to FIG. 1C, a thick field oxide 14 is then formed by thermal oxidation. Since the oxidizing speed of silicon nitride is less than that of silicon, the silicon nitride layer 12 works like a mask against thermal oxidation, so the field oxide grows only on where the substrate 10 is not covered by the silicon nitride layer 12. Finally, silicon nitride layer 12 is removed to obtain the isolation structure as shown in FIG. 1D.

The above described conventional LOCOS technique has a number of disadvantages, which become rather unacceptable when attempting to apply this technique to the fabrication of sub-micron devices. First, the oxidization of silicon does not happen only in the vertical direction but also in the horizontal direction. As a result, a part of the field oxide grows under the adjacent silicon nitride layer 12 and lifts it up, as can be seen in FIG. 1C. This is termed the "bird's beak effect" by persons skilled in the art. Secondly, due to the stresses caused by the bird's beak effect, a part of nitride in the compressed regions of silicon nitride layer diffuses to adjacent tensile strained regions at the interface of the pad oxide layer 11 and the substrate 10, and forms a silicon-nitride-like region 15. In subsequent process steps of forming gate oxides, due to the mask effect of the silicon-nitride-like layer 15, the gate oxides will be thinner than they should be. This is termed the "white ribbon effect" because a white ribbon will appear at the edges of active regions under optical microscopes.

Additionally, because the volume of silicon dioxide is 2.2 times as large as that of silicon, the field oxide 14 protrudes above the surface of the silicon substrate 10, forming a non-recessed surface. Also, the channel stop layer 13 diffuses laterally during the high temperatures used to oxidize the silicon when forming the field oxide 14. This lateral diffusion reduces the width of adjacent active regions. Decreasing the width of those active regions is a disadvantage when one is trying to scale down the dimensions of the device. Furthermore, due to the lateral expansion of the field oxide 14 during oxidation, a great deal of stress occurs in the active region. Many crystalline defects are produced near the bird's beak regions, which result in an increase of junction leakage and in a reduction of the reliability of the devices.

Many new processes have been developed to solve the above-discussed disadvantages of LOCOS, such as: adding a sidewall spacer to reduce the bird's beak effect, adding a sacrificial oxide layer to eliminate the white ribbon effect, or forming a shallow trench before forming field oxide layer to obtain a flat surface. Each of these suggestions solves some of the disadvantages of LOCOS, but they also increase the complexity of entire process and, at the same time, reduce production efficiency.

A technique called "Trench Isolation" is another approach which is used to form isolated regions. This technique comprises forming trenches on the silicon substrate by an etching procedure and filling the trenches with an insulating layer, such as a silicon dioxide layer, by chemical vapor deposition (CVD). Typically, deep narrow trenches are used to isolate one device from another, shallow trenches are used to isolate elements within a device, and wide trenches are used in areas where interconnection patterns will be deposited. Unfortunately, the conventional trench isolation technique cannot be implemented on large area openings. The insulating layer not only deposits vertically from the bottom of the trenches, but also deposits laterally from the sidewalls of the trenches. Since a typical semiconductor chip can have numerous trenches of varying widths, when the comparatively narrow trenches are filled, the comparatively wide trenches are not fully filled. If the deposition process is extended to fill the wide trenches, the field oxide formed in the narrow trenches will be too thick, causing a non-recessed surface to occur which, in turn, presents certain disadvantages during later IC processing, as is well known by those skilled in the art.

SUMMARY OF THE INVENTION

The object of the present invention is to provide a method of forming device isolation regions for an integrated circuit, in which field oxide is selectively grown in trenches, and vertically grown from the bottom of the trenches, without lateral deposition, therefore forming field oxides of the same thickness in trenches of different sizes.

In accordance with the object of the present invention, a method of forming device isolation regions on a silicon substrate by double liquid phase deposition is achieved. This method comprises the following steps: a pad oxide layer is preferably formed on the silicon substrate; a silicon nitride layer is formed on the pad oxide layer; portions of the silicon nitride and pad oxide layers not covered by a mask pattern are etched through and into the silicon substrate so as to provide a plurality of wide and narrow trenches within the silicon substrate that will form the device isolation regions; silicon nitride spacers are formed on the sidewalls of the trenches; a thin oxide layer is grown on all exposed surfaces of the substrate; a first liquid phase deposition oxide layer is formed on the thin oxide layer and is densified by a thermal process to form cracks therein; the silicon nitride layer and silicon nitride spacers are removed through the cracks, wherein the first liquid phase deposition oxide layer over the silicon nitride layer and silicon nitride spacers are also lift-off; the pad oxide layer is then removed; and a second liquid phase deposition oxide layer is formed on the first liquid phase deposition oxide layer so as to fill the trenches.

BRIEF DESCRIPTION OF THE DRAWINGS

The present invention will be more fully understood from the following detailed description of the preferred embodiment with reference to the accompanying drawings, wherein.

DETAIL DESCRIPTION OF THE PREFERRED EMBODIMENT

Figure 1A:
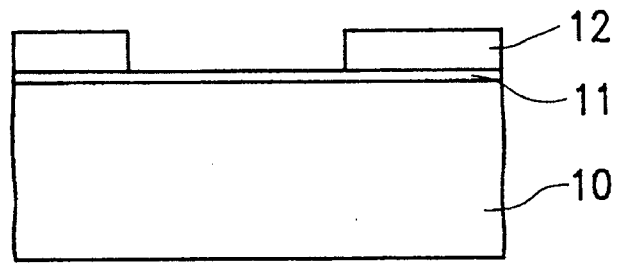
FIGS. 1A to 1D are cross-sectional views showing the process steps of conventional LOCOS technique.
Figure 1B:
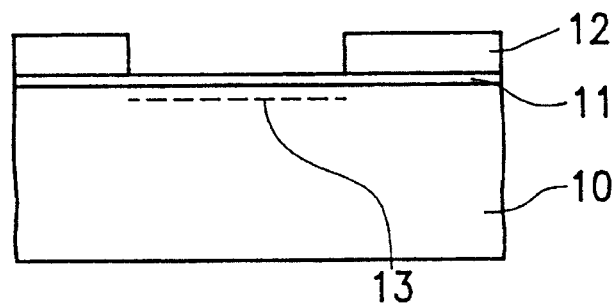
Figure 1C:
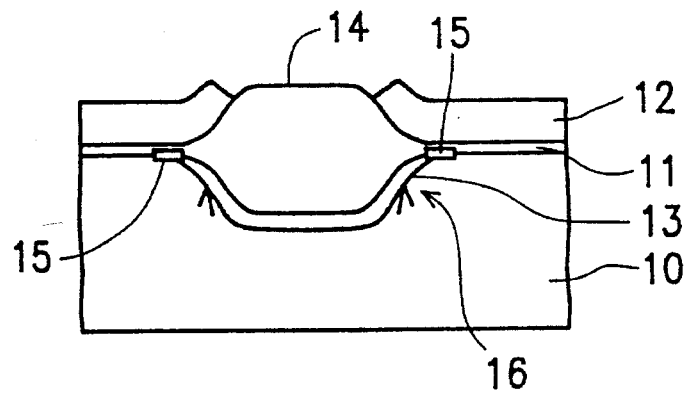
Figure 1D:
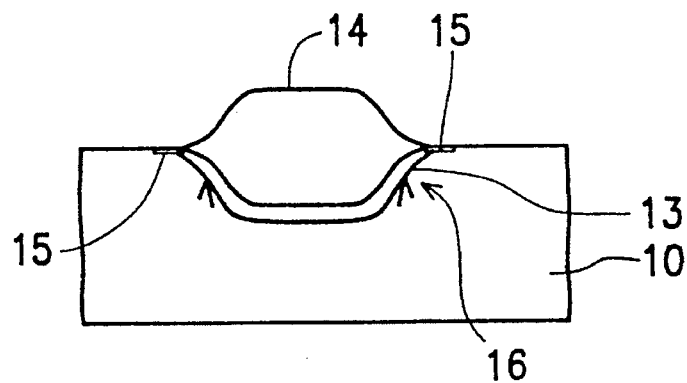
Figure 2A:
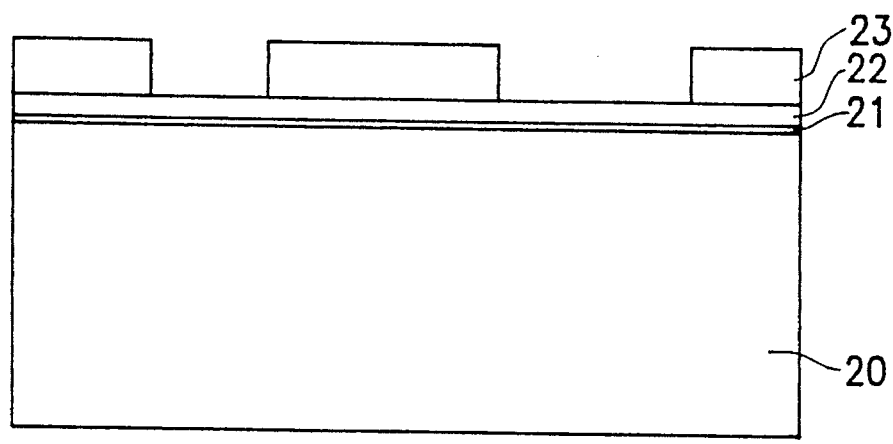
FIGS. 2A to 2F are cross-sectional views showing the process steps of one preferred embodiment according to the present invention.

Referring now more particularly to FIG. 2A, there is shown a semiconductor substrate, such as a mono-crystalline silicon substrate 20. A pad oxide layer 21 is thermally grown or deposited by CVD on the surface of the silicon substrate 20 to a preferred thickness of between 50 Å to 500 Å. A silicon nitride layer 22 with thickness of between 500 Å to 3000 Å is deposited by CVD over the pad silicon oxide layer 21. A photoresist layer 23 is coated on the surface of the silicon nitride layer 22 and patterned using conventional lithography procedures.

Figure 2B:
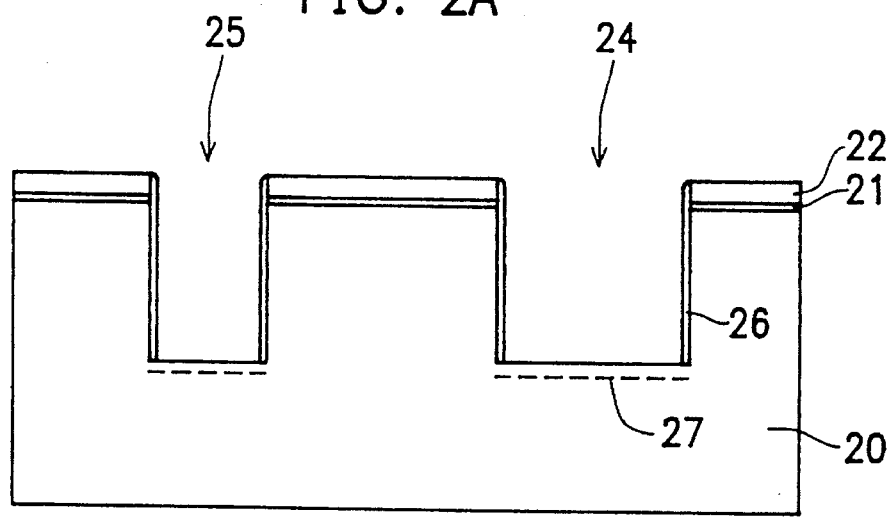

Referring now to FIG. 2B, the photoresist layer 23 acts as a mask. The exposed portions of silicon nitride layer 22 and the pad oxide layer 21 not covered by the photoresist 23 are etched through preferably by an anisotropic etching technique, such as and preferably a Reactive Ion Etching (RIE) procedure. The etch continues into the silicon substrate 20 to provide, for example, both a wide trench 24 and a narrow trench 25 where the device isolation regions will be formed. The trenches 24 and 25 have a depth of between 4000 Å to 10000 Å. The photoresist layer 23 is stripped off using a chemical solution appropriate for the photoresist used.

A layer of silicon nitride is deposited overlying the exposed surface of the silicon nitride layer 22, pad oxide layer 21, and in trenches 24 and 25, which is then etched back preferably by RIE to leave silicon nitride spacers 26 on the sidewalls of the trenches 24 and 25. The silicon nitride spacers 26 have a preferred thickness of between 200 Å to 1000 Å.

Channel stop layers 27 are formed by selectively implanting impurities into the silicon substrate 20 through the trench 24 and 25. For example, boron ions are implanted with an energy of between 10 to 50 KeV and a dosage of between $1 \times 10^{13}$ to $1 \times 10^{14}$ atoms/cm$^2$. This is an optional step to the method of this invention.

Figure 2C:
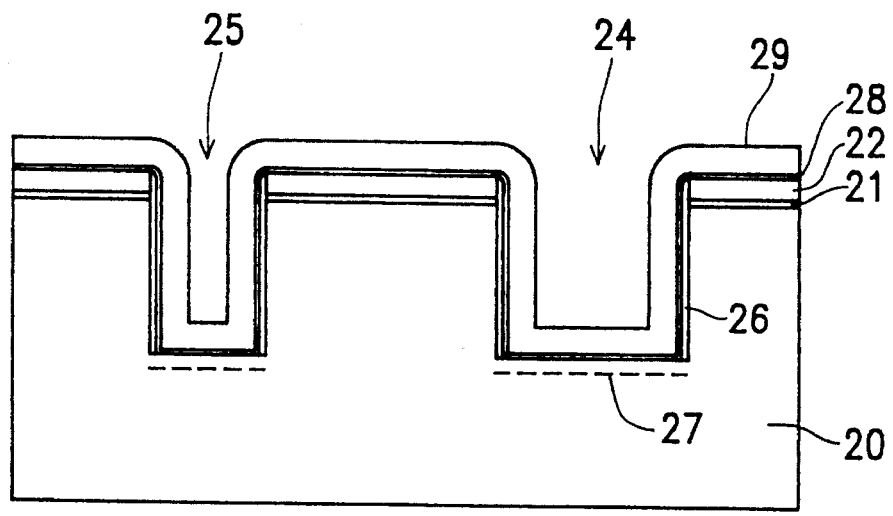
Figure 2D:
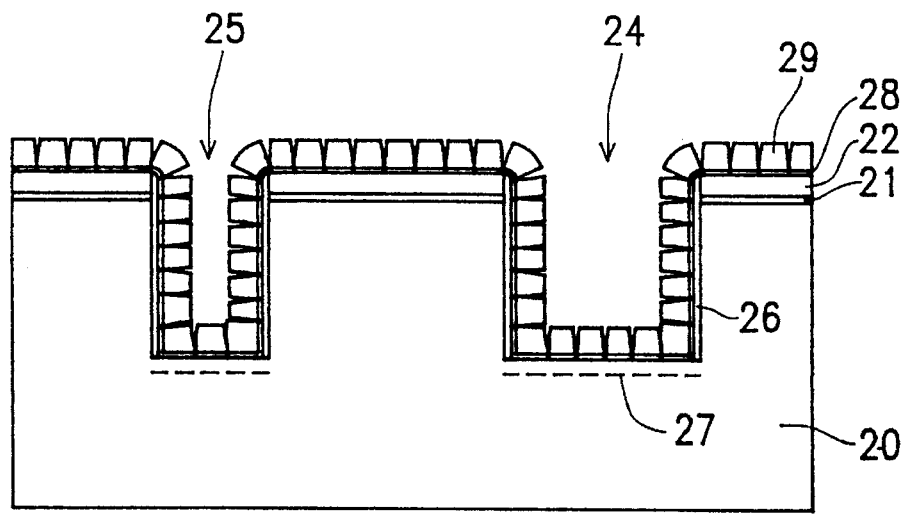
Figure 3:
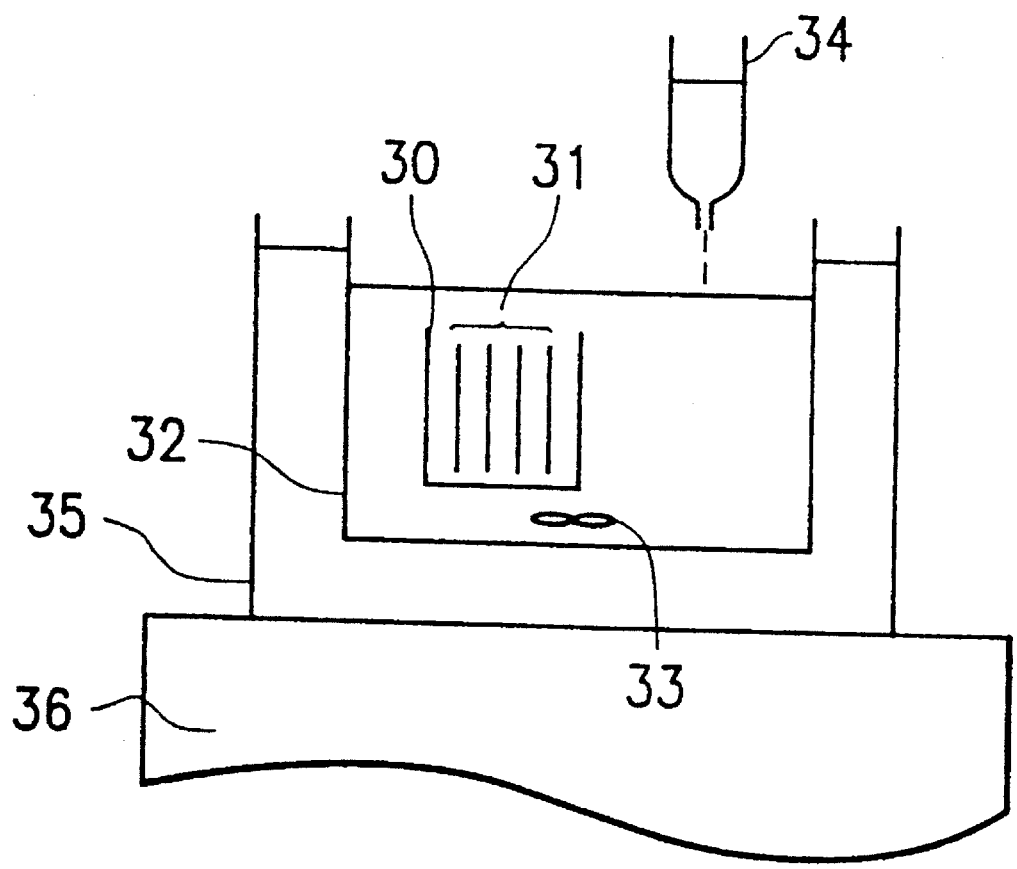
FIG. 3 shows a liquid phase deposition (LPD) device which may be used in connection with the method according to the present invention.

Referring to FIG. 2C, a thin oxide layer 28 is formed preferably by CVD, which covers all the exposed surfaces of the silicon nitride layer 22, silicon nitride spacers 26, and silicon substrate 20. The thin oxide layer 28 can also be formed by other techniques, such as oxidation (silicon nitride resists oxidation, but is not impervious to it). The substrate 20 is next placed in a liquid phase deposition (LPD) device as shown in FIG. 3, to form a first LPD oxide layer 29 overlying the thin oxide layer 28. The liquid phase deposition device includes a reactor 32 containing hydrofluosilicic acid ($H_2SiF_6$) as a reactant, a carrier 30 placed in the reactor 32 for holding silicon wafers 31, a stirrer 33 for stirring the reactant, a injector 34 to add boric acid ($H_3BO_3$) into the reactor 32 to keep the hydrofluosilicic acid saturated, a water bath 35, and a temperature controlled heater 36, which maintains the temperature of the water bath 35 between 33° C. and 37° C. The hydrofluosilicic acid ($H_2SiF_6$) is saturated with $SiO_2$ powder. Liquid phase deposition of $SiO_2$ is described in the article entitled "A Selective $SiO_2$ Film-Formation Technology Using Liquid-Phase Deposition for Fully Planarized Multilevel Interconnections," J. Electrochem. Soc., Vol., 140, No. 8, August 1993, the disclosure of which is hereby incorporated herein by reference. The first LPD oxide layer 29 and the thin oxide layer 28 are next densified by a thermal process which is performed at a temperature of between 800° C. to 1000° C. Cracks are then formed within the above oxide layers 28 and 29 due to the shrinkage thereof, as shown in FIG. 2D.

Figure 2E:
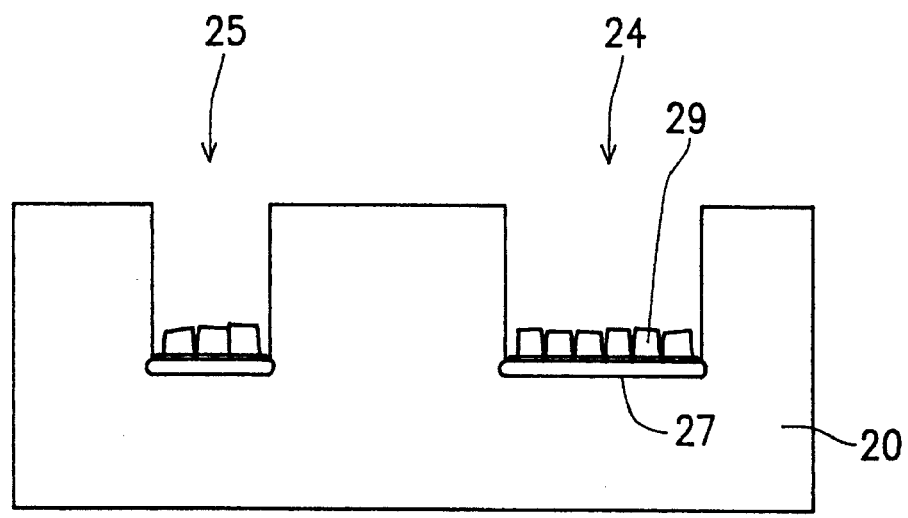

Referring to FIG. 2E, the silicon nitride layer 22 and silicon nitride spacers 26 are stripped off in a phosphoric acid solution ($H_3PO_4$). At the same time, the first LPD oxide layer 29 and thin oxide layer 28 over the silicon nitride layer 22 and silicon nitride spacers 26 are also lifted off when the underlying silicon nitride layers are dissolved when stripped off. The pad oxide layer 21 is removed by either a wet or dry etching method. The cracked silicon dioxide layers 29 at the bases of trenches 24 and 25 remain in place.

Figure 2F:
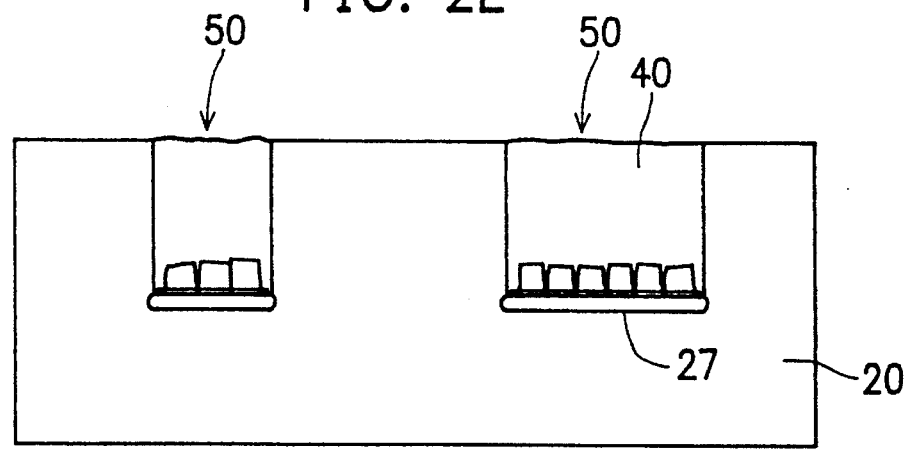

Referring now to FIG. 2F, the substrate 20 is placed in the liquid phase deposition device again. A second LPD oxide layer 40 is then formed to fill the trenches 24 and 25. Since LPD has a relatively good deposition selectivity, silicon dioxide ($SiO_2$) will only deposit on silicon dioxide or polysilicon, not on other materials such as silicon, tungsten, or photoresist. In the present embodiment, since the first LPD oxide layer 29 is located on the bottom of the trenches 24 and 25, the second LPD oxide layer 40 will only be deposited vertically, without lateral deposition. Therefore, no matter how wide the trenches 24 and 25 are, the second LPD oxide layer 40 with the same thickness, for example, between 4000Å 4000 Å to 10000 Å, will be formed in all trenches 24 and 25. The thickness of the deposited silicon dioxide layer can be easily controlled by controlling the deposition time.

The substrate 20 is preferably heated at 800° C. to 1000° C. in an oxygen-free environment for 30 to 60 minutes, to densify the second LPD oxide layer 40. Similar cracks are formed within the second LPD oxide layer 40 due to the shrinkage thereof. Finally, an insulating layer, such as a silicon dioxide layer, is deposited by CVD and etched back by RIE to fill the cracks. This completes the definition of device isolation regions 50 by the silicon dioxide filled trenches 24 and 25.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming device isolation regions on a silicon substrate, comprising the following steps:

forming a pad oxide layer over said silicon substrate;

forming a silicon nitride layer over said pad oxide layer;

etching through portions of said silicon nitride layer and said pad oxide layer not covered by a mask pattern and into said silicon substrate so as to provide a plurality of trenches, at least one of said trenches having a width which is different from another one of said trenches in said silicon substrate, said plurality of trenches defining said device isolation regions;

forming silicon nitride spacers on the sidewalls of said trenches;

forming a first silicon dioxide layer on exposed surfaces of said silicon nitride layer, said silicon nitride spacers, and said silicon substrate;

densifying said first silicon dioxide layer by a thermal process to form first silicon dioxide layer cracks;

stripping said silicon nitride layer and said silicon nitride spacers through said first silicon dioxide layer cracks, wherein said first silicon dioxide layer where it overlies said silicon nitride layer and said silicon nitride spacers is lifted off;

forming a second silicon dioxide layer overlying the first silicon dioxide layer remaining in said trenches by using liquid phase deposition so as to fill said trenches thereby completing the device isolation regions.

2. The method of claim 1, further including removing said pad oxide layer before the second silicon dioxide layer overlying the first silicon dioxide layer remaining in said trenches is formed by liquid phase deposition.

3. The method of claim 2, wherein said pad oxide layer has a thickness between approximately 50 Å to 200 Å.

4. The method of claim 1, wherein said the step of forming the first silicon dioxide layer is a two step process of which the first step comprises forming a relatively thin silicon dioxide layer on exposed surfaces of said silicon nitride layer, said silicon nitride spacers, and said silicon substrate and the second step comprises forming a relatively thicker silicon oxide layer on the relatively thin layer using liquid phase deposition.

5. The method of claim 4, wherein said relatively thicker silicon oxide layer has a thickness between approximately 4000 Å to 10000 Å.

6. The method of claim 1, wherein said silicon nitride layer has a thickness between approximately 500 Å and 3000 Å.

7. The method of claim 1, wherein said trenches extend into said silicon substrate for a depth between approximately 4000 Å and 10000 Å.

8. The method of claim 1, wherein said silicon nitride spacers have a thickness between approximately 200 Å and 1000 Å.

9. The method of claim 1, wherein said second silicon dioxide layer overlying the first silicon dioxide layer has a thickness between approximately 4000 Å and 10000 Å.

10. The method of claim 1, wherein said heating process is performed at a temperature of between 800° C. to 1000° C.

11. The method of claim 1, wherein said liquid phase deposition is performed at 33° C. to 37° C. using saturated hydrofluosilicic acid as a reactant.

12. The method of claim 1, wherein after forming said silicon nitride spacers further comprising a step of implanting impurities into said silicon substrate underneath said wide and narrow trenches to form channel stop layers.

13. The method of claim 12, wherein said channel stop implanting step uses boron ions at a energy of between 10 to 50 KeV and a dosage of between $1 \times 10^{13}$ to $1 \times 10^{14}$ atoms/cm$^2$.

14. The method of claim 1, further comprising the following steps:

densifying the second silicon dioxide layer by said heating process to form second silicon dioxide layer cracks; and depositing and etching back an insulating layer to fill said second silicon dioxide layer cracks.

15. A method of forming device isolation regions on a silicon substrate, comprising the following steps:

forming a pad oxide layer over said silicon substrate;

forming a silicon nitride layer over said pad oxide layer;

etching through portions of said silicon nitride layer and pad oxide layer not covered by a mask pattern and into said silicon substrate so as to provide a plurality of trenches, at least one of said trenches having a width which is different from that of another said trenches in said silicon substrate, said plurality of trenches defining said device isolation regions;

forming soluble spacers on the sidewalls of said trenches;

forming a first silicon dioxide layer on exposed surfaces of said silicon nitride layer, said soluble spacers, and said silicon substrate;

densifying said first silicon dioxide layer by a thermal process to form first silicon dioxide layer cracks;

stripping said silicon nitride layer and said soluble spacers through said first silicon dioxide layer cracks, wherein said first silicon dioxide layer where it overlies said silicon nitride layer and said soluble spacers is lifted off;

removing said pad oxide layer; and forming a second silicon dioxide layer overlying the first silicon dioxide layer remaining in said trenches by using liquid phase deposition so as to fill said trenches thereby completing the device isolation regions.

* * * * *